(12) United States Patent
Dress et al.

(10) Patent No.: US 6,519,448 B1
(45) Date of Patent: Feb. 11, 2003

(54) PERSONAL, SELF-PROGRAMMING, SHORT-RANGE TRANSCEIVER SYSTEM

(75) Inventors: William Alexander Dress, Knoxville, TN (US); William Benjamin Dress, Knoxville, TN (US); John Austin Collins, Knoxville, TN (US)

(73) Assignee: William A. Dress, Loeur d'Alene, ID (US)

( * ) Notice: Subject to any disclaimer, the term of this patent is extended or adjusted under 35 U.S.C. 154(b) by 0 days.

(21) Appl. No.: 09/423,574

(22) PCT Filed: Sep. 30, 1998

(86) PCT No.: PCT/US98/20531

§ 371 (c)(1),
(2), (4) Date: Nov. 10, 1999

(87) PCT Pub. No.: WO00/19632

PCT Pub. Date: Apr. 6, 2000

(51) Int. Cl.⁷ .................................................. H04B 5/00
(52) U.S. Cl. ....................... 455/41; 455/66; 455/568; 455/569; 455/90; 455/351; 381/311
(58) Field of Search ........................... 455/66, 568, 569, 455/570, 575, 90, 350, 351, 344, 41; 381/311, 315, 79, 74

(56) References Cited

U.S. PATENT DOCUMENTS

| | | | | |
|---|---|---|---|---|
| 4,816,769 A | * | 3/1989 | Ma ............................... 329/50 |
| 4,864,599 A | * | 9/1989 | Saegusa et al. ............. 455/411 |
| 5,428,836 A | * | 6/1995 | Sanecki ....................... 455/315 |
| 5,687,218 A | * | 11/1997 | Nakayama .................. 455/415 |
| 5,794,163 A | * | 8/1998 | Paterson et al. ........... 455/568 |
| 5,799,097 A | * | 8/1998 | Lo .............................. 381/187 |
| 5,845,197 A | * | 12/1998 | Hada ........................... 455/90 |
| 5,911,119 A | * | 6/1999 | Bartholomew .............. 455/402 |
| 6,021,207 A | * | 2/2000 | Puthuff et al. .............. 381/330 |
| 6,026,082 A | * | 2/2000 | Astrin ......................... 370/336 |
| 6,032,028 A | * | 2/2000 | Dickey ........................ 455/110 |
| 6,118,882 A | * | 9/2000 | Haynes ....................... 381/374 |
| 6,119,002 A | * | 9/2000 | Alanara ...................... 455/434 |
| 6,122,388 A | * | 9/2000 | Feldman ..................... 381/322 |
| 6,141,356 A | * | 10/2000 | Gorman ...................... 370/493 |
| 6,185,418 B1 | * | 2/2001 | MacLellan .................. 455/418 |
| 6,307,945 B1 | * | 10/2001 | Jamieson .................... 381/315 |
| 6,339,695 B1 | * | 1/2002 | Clark .......................... 455/41 |
| 2002/0016188 A1 | * | 2/2002 | Kashiwamura ............. 455/568 |

* cited by examiner

*Primary Examiner*—William Trost
*Assistant Examiner*—Marcos Torres
(74) *Attorney, Agent, or Firm*—Gray Cary Ware & Freidenrich, LLP

(57) ABSTRACT

A method for establishing a communication link between a transmitter and a receiver for the purpose of relaying audio material derived from an existing source to a user desiring to remain unencumbered by the source apparatus comprises the steps of: placing the receiver unit into physical contact with the transmitter unit, powering up both transmitter and receiver units, and waiting for an indication of process completion before setting the receiver unit in place. The transmitter unit searches for a free rf communication channel, initiates transmission of user-chosen audio material over permitted broadcast bands, and programs the receiver unit with information allowing it to receive on the same channel. The receiver unit is lightweight, worn in the outer canal of the ear or on the head in the conventional manner. The entire programming and transmission process takes place automatically without further user intervention. This method allows multiple users in proximity to receive their individually chosen source material or to enjoy a common transmission.

37 Claims, 4 Drawing Sheets

PERSONAL, SELF-PROGRAMMING, SHORT-RANGE TRANSCEIVER SYSTEM

CROSS-REFERENCE TO RELATED APPLICATION

This application is national stage application under 35 U.S.C. §371 of, and claims a benefit of priority under 35 U.S.C. §120 and/or 35 U.S.C. §365 from, copending international application PCT/US98/20531, filed Sep. 30, 1998, now WO 00/19632, published Apr. 6, 2000.

TECHNICAL FIELD

The technical field of the invention is that of a consumer electronics device based on wireless transmission of information. The range of transmissions is purely local (i.e., short distances up to thirty meters, more or less) and designed to provide a personal transmission channel from a nearby audio source such as a tape recorder, record player, compact-disk player, radio set, and so forth. The transmitter and receiver technology operate in the standard radio-frequency bands such as the US 88 Megahertz (MHz) to 108 MHz FM band or in the unregulated low-power bands where standard frequency- and phase-modulation techniques are employed or in the very-low frequency band where pulse-modulation techniques are common.

BACKGROUND ART

The field of consumer audio electronics comprises a wide variety of personal listening devices—from hand-held and wearable radios and communicators to portable devices for retrieving audio information stored in many forms such as cassette-tape media and compact-disk media of various types. There also exist various earphone devices auxiliary to or integral with many of these personal entertainment devices. The vast majority of these personal listening or entertainment devices require that the sound storage and playback unit, i.e., the sound source that produces an electrical signal in the audio range, be carried along with the user. A majority of these later devices that are equipped with personal earphone units send an electrical signal from the playback device to the earphone device via a cable or wire, potentially encumbering the user or providing an easily noticed indicator that the user is engaged in some sort of entertainment activity via an audio source. Of course, there are a large number of such commercial devices, ranging from those trade-marked to those fully patent-protected, that are easily recognizable in the marketplace. It is to be noted that the field of such devices, comprising the bulk of the prior art, is too large to enumerate in this document. The following discussion will be restricted to devices that are more clearly and particularly focused in the field of the present invention.

A commonly encountered device is a fully functional FM or AM radio built into a set of wearable headphones. The advantages are complete portability, wearability, and tune-ability over the full broadcast bands, including stereo reception for the FM band. For example U.S. Pat. No. 4,930,148 describes a headband radiophone containing a receiver-transmitter to reciprocally transmit or receive signals. Another example is furnished by U.S. Pat. No. 5,095,382 which describes a wireless headphone designed to reciprocally transmit and receive signals by means of an infrared beam of light.

There are also several types of wireless headphones on the market primarily designed to allow the user to listen to audio sources such as television or a home-music or entertainment center without disturbing others. The wireless nature of said devices allows the user freedom to move about within the restricted range of the transmissions without being encumbered by wires or cables precisely as in the present invention. These wireless headsets are meant for use in restricted areas usually confined to a few rooms in or near a dwelling and do not provide capacity for a plurality of channels for multiple users. The latter capability is achieved by purchasing multiple units. As each device comes with its own pre-assigned channel, these devices are not suitable for group activities. The present invention would fulfill the stated purposes of these existing devices yet not be burdened with the aforementioned restrictions and limitations. In particular, the present invention allows multiple independent users in the same proximity by means of its self-programming function, and it allows multiple users to share in the same locally broadcast material without requiring multiple base units or transmitters.

Closer to the present invention is U.S. Pat. No. 5,677,964, which describes a transmitter-receiver system wherein the transmitter unit is installed in an audio equipment and the receiver unit is installed in an earphone. A goal here is to allow the user to listen to information transmitted from the audio equipment without interfering with others in the vicinity or having exposed wires or cables between the audio equipment and the listener.

An invention likewise close to the present invention in the area of miniaturization by describing a device fitting within the outer canal of the ear, is U.S. Pat. No. 5,734,976 which describes a micro-receiver for receiving a high-frequency frequency- or phase-modulated signal and is based on single integrated circuits in BiCMOS technology integrating the necessary amplifiers, oscillators, modulators, demodulators, filters and audio amplifier.

The description of U.S. Pat. No. 5,677,964 includes a transmitter partially fulfilling the role of the "base unit" described in the present invention. That of U.S. Pat. No. 5,734,976 is primarily concerned with a prosthetic hearing-aid device, yet certainly meets one of the desired goals of the present invention in being small, lightweight, unobtrusive, and capable of being worn in the outer canal of the ear and containing the required receiver circuitry and power supply. Neither of these descriptions considers a base unit that automatically selects the first available frequency band for transmissions, or a base unit that automatically programs the receiver unit to receive transmissions on said frequency band, or a base unit that is functionally as portable as the receiver unit. The second description also implies that the associated transmitter unit is to be worn by the user as necessitated by utility of prosthetic hearing-aid devices. Combining the essential ideas present in these two existing inventions approaches, but does not reach, the functionality and convenience of the proposed invention.

DISCLOSURE OF INVENTION

The idea of the invention is to provide a private and unobtrusive means for a user to listen to a local (nearby) source of music or other audio entertainment or information on a dynamically selected channel that is simple to establish and does not interfere with possibly many other users at the same location. Logically and physically, the invention comprises two distinct modules: (1) a receiver or earphone and (2) a transmitter or base unit. It is thus the intention of the invention to provide a wireless connection between the earphones and base unit, allowing the user to move freely about, unencumbered by cables or wires, within the limited range of the base unit's transmissions. It is a primary intention of this invention to allow multiple users in the same location either to listen to independent sources of entertainment or information or, if desired, to share such sources with others possessing similar receiver units (earphones). Further, it is the intention of the invention that the receiver unit be small, compact, lightweight, and unobtrusive both visually and kinesthetically.

The first module consists of a lightweight, wireless, radio-frequency receiver or receiver pair (for stereo sources) mounted in lightweight headphone or head set or earphones. "Earphones" in the following description is understood to refer to any convenient ear-external or internal device consistent with the contained receiver units. The earphones may be either externally worn or internally fitted to be placed in the outer canal of the ear, as the user desires. Furthermore, the earphone receiver units are "self-programed" as described below. This latter feature ensures simplicity of operation and ease of use while maintaining flexibility of multiple devices operating in the same local area while minimizing inter-unit interference.

The second module, the transmitter or base unit, has four functions: (1) to select automatically a clear transmission channel for said transmission, (2) to program or lock the earphones to receive exclusively on said automatically preselected channel, (3) to modulate an appropriate radio frequency on said channel by the chosen audio-level input for low-power transmission to the earphones, and (4) to provide power to the earphones by way of charging their contained batteries. The base unit is likewise small, lightweight, and portable, being just large enough to contain (1) the scanning circuitry, (2) the programming circuitry, (3) the transmitter circuitry, (4) the battery-charging circuitry, (5) minimal controls and indicators, (6) appropriate signal connectors, and (7) a battery or other type of power supply.

In a typical situation, the user switches both the earphones and the base unit to the "on" position as indicated by small light-emitting diode indicators and then inserts the earphones into specially designed receptacles located in the base unit. The power-on action initiates charging of the earphone batteries should they require it. This power-on action also initiates a "scan" function comprising a sequence of events that (1) effectively searches for an "open" channel, (2) locks a frequency synthesizer or phase-locked loop to the frequency of the first open channel thus located, and (3) sends a "lock" command via contacts located in the receptacles to a frequency synthesizer or phase-locked loop in each of the earphones. At the end of this "auto-programing" sequence, (4) a "ready" indicator or signal indicates that the user may now remove the earphones and place them in position for listening, moving about the area as desired, within the limited range of the base-unit's transmitter, receiving the audio information from the source connected to the base unit via the standard process of demodulation, amplification, and presentation of the electrical signal thus obtained to the earphones' electrical-acoustic transducers.

Other users of similar devices located within the same transmission range, or even in overlapping transmission areas of the first device, will not find an open channel at the same frequency chosen by the unit just programmed or any active prior-activated units as well. Any base unit attempting to program its own earphones will scan for the first clear channel starting at one end of the selected spectrum, ensuring that no user will interfere with any other and no strong, established broadcasts will interfere with a user's auto-selected channel. The number of channels available in any area depends on the broadcast band chosen and the bandwidth (plus guard band) for each device. As an example, assume parameters consistent with the standard US FM broadcast band of 88 to 108 MHz and 100 KHz bands, there would be "room" for perhaps 200 independent users, not accounting for any strong commercial FM broadcasts, which would reduce this number by at least one unit for each such strong station.

If other users of an identical device within the same transmission range wished to listen on a common channel and hence to the same audio source as provided via transmission by any given base unit, they would simply place their compatible earphones into the receptacles of said base unit and depress a secondary "program" or "lock" control button. Such action would lock their earphones to the preselected channel of the chosen unit. In this manner, multiple users can listen to the same source, allowing for class or shared-listening activity.

Due to its compact nature, the earphone electronics are fabricated with surface-mount methods using standard integrated circuits and monolithic lumped components. Discrete components are used in the circuit where necessary to establish externally selected frequency ranges as well as other functions such as passive filters. Both receiver and transmitter units are separately powered, with the receiver earphones having a battery power supply, and the base unit either a battery or other means of power.

The key features of the invention are summarized as its ability to avoid interference with commercial broadcasts due to the auto-scan feature; to be compliant with communication authorities' rules of low power and short range in certain restricted bands; to its "foolproof" use based on minimal controls and no adjustments; to provide wireless operation; to contain rechargeable or replaceable batteries in base unit; to contain rechargeable and/or replaceable batteries in earphones; to restrict the physical dimensions of the base unit into a small, compact, lightweight, and easily transportable and detachable module independent from any particular source of program material; and to provide the user with the earphones that are ultra-light weight and/or fit in outer ear or mounted on a lightweight, supporting frame.

Although the primary conception and purpose of this invention is to provide an auxiliary but extended capability for standard sources of audio material in the sense that any source device having the required "signal" or "audio" output connector with compatible impedance characteristics can be connected to the base unit described in this invention, there are numerous variations possible based on the described invention besides the mentioned uses of transmitting local audio sources to listeners not wishing to be encumbered by wires or highly visible head pieces. These variations may be differentiated, among other characteristics, by various sources for the transmitted audio material. The preferred embodiment presented herein should in no way restrict the present invention to a particular configuration as regards usage.

A modification of the base unit could be made with a built-in microphone or an input with an impedance-matching amplifier and gain control designed for such a microphone. Such a unit could be used to send verbal messages or any other sound based on sound pressure waves to those with compatible earphones. For example, a type of selective-broadcast communication only to users having completed the "lock" process with the centrally chosen base unit could be established, allowing only those users to receive said communication, even though in a crowd or noisy location.

A modification of the base unit could be made to equip it with a built-in radio receiver allowing the user to select a local radio station for listening remotely from said radio receiver. Otherwise and more generally stated, the standard types of sound reproduction devices could incorporate the invention described here rather than said invention serving said devices as an auxiliary. In which case, the auto-scanning and self-programming functions would be retained as essential to benefit from the innovations described herein.

BEST MODE FOR CARRYING OUT THE INVENTION

A transmitter-receiver system in accordance with the present invention is comprised of a transmitter unit (the "base unit") that is either a separate module connected to an audio source by means of a cable or suitable connector or integral to such a source, and a receiver unit installed in an earphone or earphone pair ("earphones"). The inventive arrangements are directed to methods and apparatuses for establishing a clear channel for the desired transmission and for locking the receiver units to said clear channel, ensuring that said transmitter and receiver units function together as an integrated system. Secondary goals of lightweight and unobtrusive earphones, the maintenance of sufficient energy for the earphones, and wireless communications that includes modulation, demodulation, methods of maintaining frequency stability, amplification of rf and audio signals, and driving appropriate electro-acoustic transducers are accomplished by incorporating features and devices that are well known to those familiar in the art The present invention has been accomplished to provide a transmitter-receiver system which eliminates the aforesaid problems and simultaneously meets the particular objectives of effecting a private and unobtrusive means of listening to a nearby source of information, said means being simple to use yet having minimal interference with other users of the same rf band in the same local area. To this end, a wireless rf link between a self-programming, transmitting base unit, and a receiver mounted in small, lightweight earphones are described in detail. A particular preferred means for effecting these goals is presented, along with obvious and useful variations that extend the preferred means in several non-essential ways.

A power source, typically a battery, together with its necessary connections to each of the functional modules and devices depicted is to be understood to be functionally present in all of the figures, as is a suitable return path (earth or ground) for returning current to the power source, thus completing the circuits as required.

Figure 1:
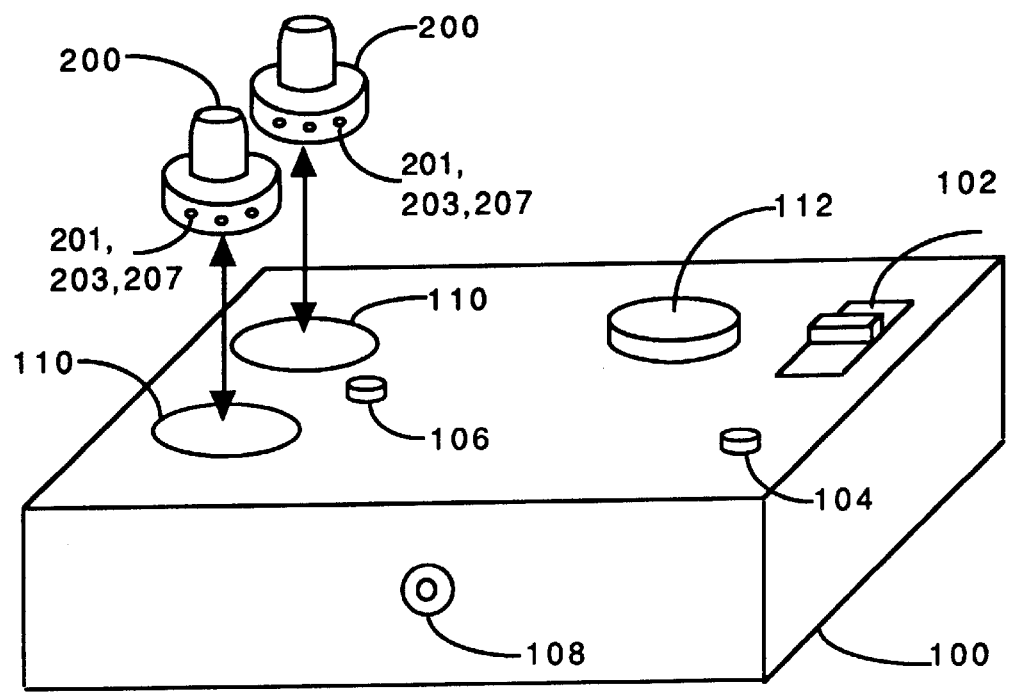
FIG. 1 depicts a particular representation of the base units and illustrates how the earphones fit into the provided receptacles.

Referring now to the drawings wherein like numbers refer to like parts, FIG. 1 is a conceptual view showing the relationship between the base unit 100 and the earphones 200 before and after the programming operation and schematically indicating the process of such programming. Other configurations are possible, so the illustration of this particular configuration is not to be restrictive for implementation or use of the invention. A particular placement of the controls comprising power switch 102, indicator lights 104 and 106, and audio-input connector 108 are also shown. Control 112 allows manual programming of the earphones 200 once the programming operation is complete as indicated by indicator light 104 changing state from flashing to steady. The arrows indicate the process of inserting and removing the earphones 200 from their programming receptacles 110 in base unit 100. Contacts 201, 203, and 207, located on earphones 200, have mating contacts (not shown) in base unit 100 and allow communications necessary for the programming activity to take place between these two functional modules.

Figure 2:
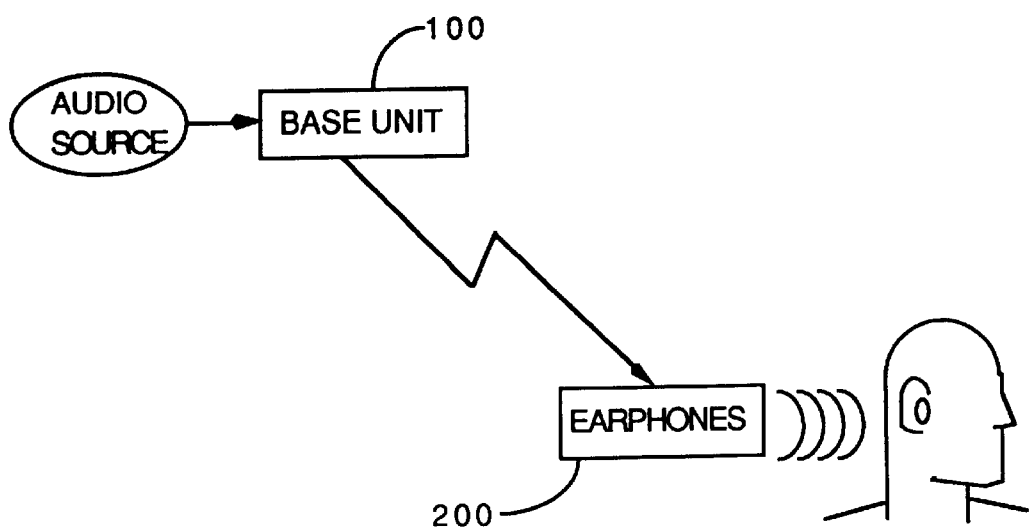
FIG. 2 is a block diagram of a typical application illustrating the logical relation of the audio source, base unit, earphones, and the user following programming by the base unit.

FIG. 2 is a block diagram showing the unified operation of the earphones 200 and the base unit 100. The earphones 200 have already been programmed by the scanning function of the base unit 100 and are shown receiving the rf signal modulated by the audio source, which may be any of a plurality of readily available devices such as tape players, compact-disk players, and so forth. The presence of the user is indicated by a sketch of a head in the figure.

Figure 3:
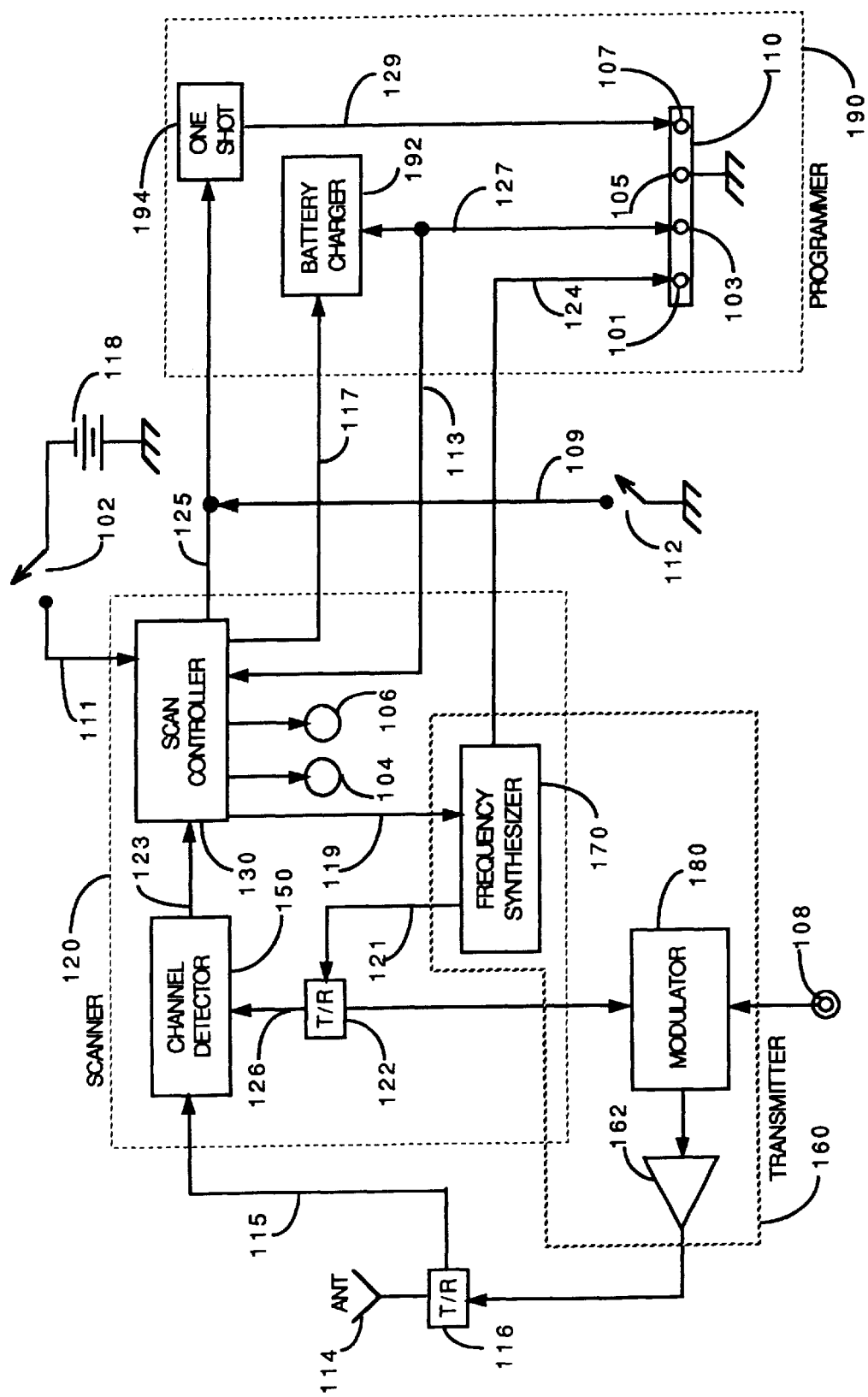
FIG. 3 is a functional block diagram of the base unit showing the logical relationships between the three functional modules of scanner, transmitter, and programmer.

FIG. 3 is a block diagram of base unit 100 of FIG. 1. The operation of this unit is described in functional order starting with activation of the power-on switch 102, which supplies power from battery 118 to all associated electronics via line 111, resets all circuits and logic in base unit 100 to a standard initial state, initiates the scanning and programming sequences, and causes the "scan" indicator light 104 to flash, indicating that the scanning sequence is in progress and that the unit has power. The function of the three submodules are described here, while details are deferred to a subsequent figure.

The scanner 120 comprises a scan controller 130, a channel detector 150, a shared frequency synthesizer 170, a transmit-receive switch 122 and indicator lights 104 and 106. Upon power-on, the scan controller 130 examines the state of the earphones 200 via line 113; if not turned on before insertion into receptacles (110 of FIG. 1), warning light 106 is illuminated indicating a procedural error to be corrected. The latter criterion being met or the error corrected, the scan controller 130 signals the programmer 190 via line 117 and starts a frequency-sweep sequence, sending coded information to the frequency synthesizer 170 via line 119, controlling the frequency-scanning sequence. The channel detector 150 receives the synthesized frequency (local oscillator frequency) from line 121 via the switch 122, which is set to connect the frequency synthesizer 170 to the channel detector 150 during the initialization sequence. The channel detector 150 then examines the signal from the antenna 114 via line 115 which signal is heterodyned with the synthesized frequency entrant on line 121 in a manner familiar to those skilled in the art. The transmit-receive switch 116 is likewise configured to connect the antenna to the channel detector 150 during the initialization sequence. The function of the channel detector 150 is to locate a frequency subband where there is little or no carrier present. Such a subband being located, the channel detector 150 signals the scan controller 130 via line 123, whereupon scan controller 130 stops commanding the frequency synthesizer 170 to advance, sends a signal to the programmer 190 via line 125, changes the state of indicator light "scan" 104 from flashing to continuously on, indicating that the user may proceed to the next stage. Additionally, switches 116 and 122 are set to the alternate or "transmit" state via signals (not shown) from the scan controller 130.

The programmer 190 comprises a battery charger 192 and a one-shot circuit 194. Details concerning the action of the battery charger 192 are known to those familiar with the art and are not elaborated upon here. Upon receiving a start signal via line 117, the battery charger examines the voltage level on each of the batteries in the earphones 200 (FIG. 1) and supplies any current needed to charge them to the operational point, said charging operation taking place during the scan sequence; the charging current is presented to the earphones via line 127 through contact 103. Contact 107 made to each earphone via connector block or receptacle 110 transmits an enabling level from oneshot 194 via line 129. Those skilled in the art recognize that oneshot 194 can be made to emit a logic pulse of predetermined duration given a leading- or trailing-edge trigger input as may be applied by the scan controller 130 upon completion of its scan process or at the discretion of the user via external control 112 via line 109. Contact 101 in connector block 110 receives a sample of the frequency of the located rf subband via line 124. Contact 105 in connector block 110 provides a common ground to the earphones.

The transmitter 160 comprises the shared frequency synthesizer 170, a modulator 180, and an rf amplifier 162. At the end of the scan cycle as indicated by signals from the scan controller 130, the switch 122 is configured so that the signal from frequency synthesizer 170 is applied as the carrier frequency to the modulator 180. The details of the phase and frequency modulation as performed by modulator 180 are well known to those skilled in the art and need not be described in detail. The audio-in signal via connector 108 is used to modulate said carrier frequency, whence the modulated carrier is amplified as necessary by rf amplifier 162 and allowed to reach antenna 114 through switch 116, which has changed state via a signal (not shown) from scan controller 130.

Figure 4A:
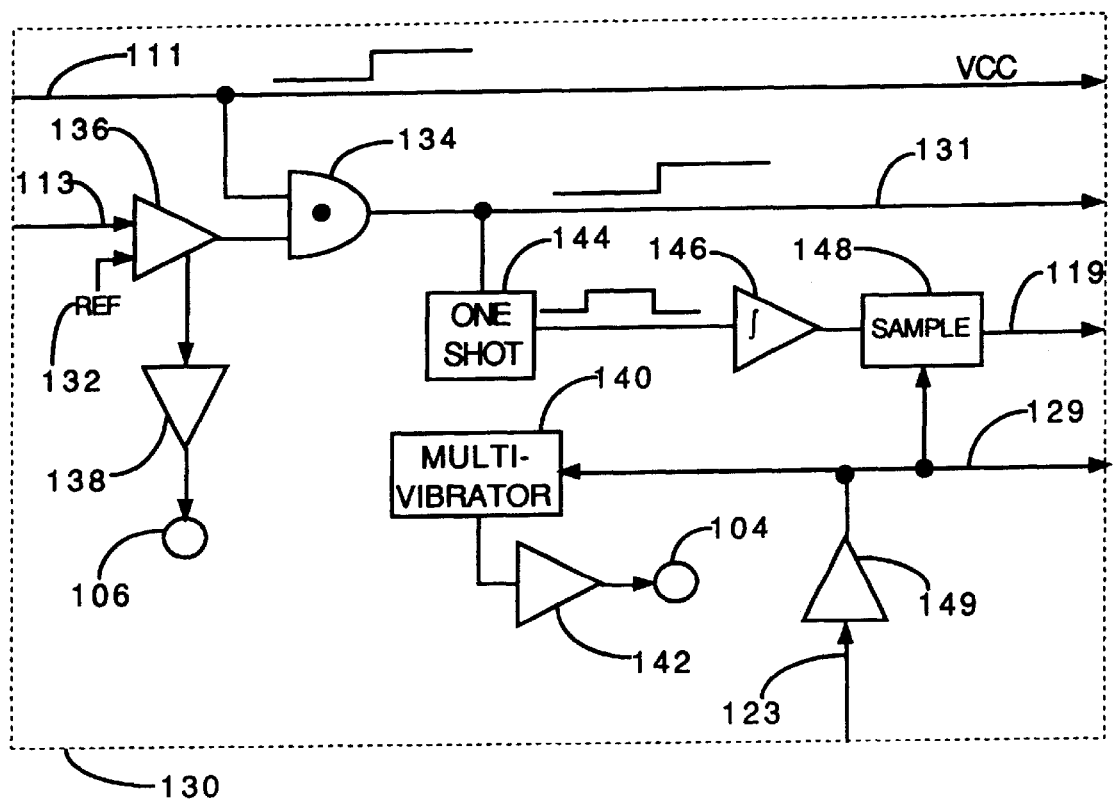
FIG. 4 shows details of the functional modules comprising the base unit depicted in FIG. 3.

FIG. 4a shows the details of the scan controller 130. Upon receiving power via line 111 from the power-on switch (102 FIG. 3), AND gate 134 senses the state of the unit's power. The state of earphones 200 (FIG. 1) is sensed via line 113 by comparator 136 whose output, indicating "on" state for the earphones 200 (FIG. 1), is also applied to AND gate 134. Reference 132 in an internally set parameter chosen according to design parameters. The complementary state of the comparator 136 is sent to buffer amplifier 138 which connects to "fault" indicator light 106 should the earphones 200 (FIG. 1) be in the power-off state. The AND gate 134 passes the "start" logic level obtained from the power line via line 111 when power is on in both the base unit 100 (FIG. 1) and earphones 200 (FIG. 1). Power-on switch 102 (FIG. 3), via line 111, also applies power (via the $V_{CC}$ connections common to all modules) to multivibrator 140 to send a flashing signal to buffer 142 and thence to indicator light 104 indicating that a scan is in progress. The logic level from AND gate 134 triggers oneshot 144 which emits a logic pulse or level of duration of approximately 1 second, predetermined by the time-constant capacitor (not shown). This level is applied to integrator 146 and thence to sample-and-follow 148. The output of sample-and-follow 148 follows the input from the integrator 146 until it receives a "sample" command. Said output is sent to the frequency synthesizer 170 (FIG. 3) via line 119. Once a clear channel is located as determined by the channel detector 150 (FIG. 3), line 123 is activated by said channel detector. A high logic level on line 129, buffered by amplifier 149, causes sample-and-follow 148 to sample and transfer a digitally coded version of its input voltage to its internal digital memory, effectively maintaining said voltage level for subsequent presentation to the frequency synthesizer 170 (FIG. 3). The particular details of how said sample-and-follow accomplishes its function are known to those familiar with the art Said logic level on line 129 also halts multivibrator 140, leaving it in a "high" state so that indicator light 104 is now steadily illuminated indicating an end to the scan process and communicating the "ready" state to the user.

Figure 4B:
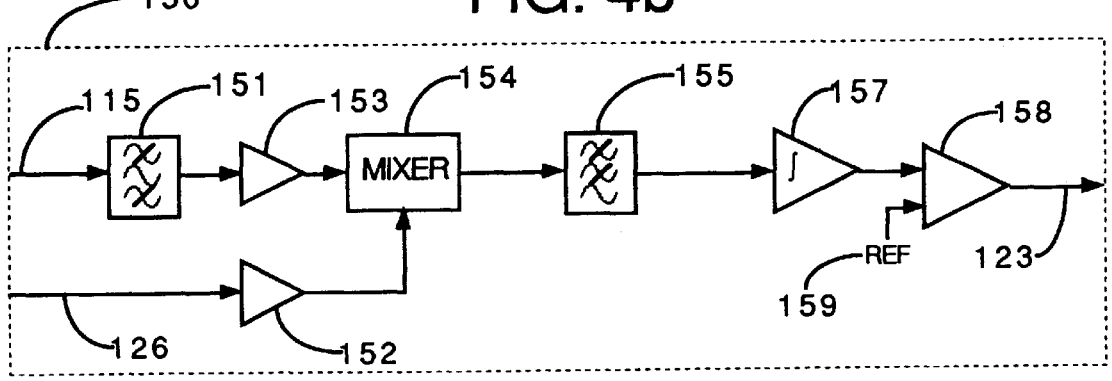

Referring now to FIG. 4b, which depicts the details of the channel detector 150, an rf signal from the antenna 114 (FIG. 3) enters via line 115 and is filtered in band-pass filter 151 which is set broad enough to encompass the frequency band of interest over which the transmitted information might appear, depending on the particular operating band prechosen for the device. Said signal thence passing to rf amplifier 152 and to mixer 154 wherein said antenna signal is heterodyned with the frequency signal from frequency synthesizer 170 (FIG. 3) via line 126 after being buffered by amplifier 153. The heterodyned signal, now at baseband of the frequency from said frequency synthesizer, is passed through low-pass filter 155. Filtered by integrator 157 to remove ripples, the slowly varying, nearly DC signal is presented to comparator 158. Said comparator compares the input signal to a preset voltage reference level 159. When said signal falls below a said reference value, the comparator communicates this information as a voltage level via line 123.

Figure 4C:
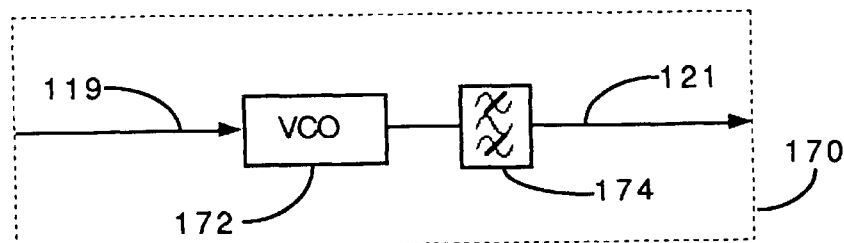

FIG. 4c shows the details of the frequency synthesizer 170 which comprises a voltage-controlled oscillator 172 and a band-pass filter 174 in this embodiment. Line 119 conveys the ramp signal produced by integrator 146 (FIG. 4a) via sample-and-follow 148 (FIG. 4a), causing the voltage controlled oscillator 172 to slowly increase its frequency from the lower end of the preselected frequency band to the upper end of said band. Said increase in frequency is presented to the channel detector 150 via lines 121 and 126 (FIG. 3) causing said channel detector to scan the frequency band of interest until the input to said voltage controlled oscillator no longer changes.

Figure 5:
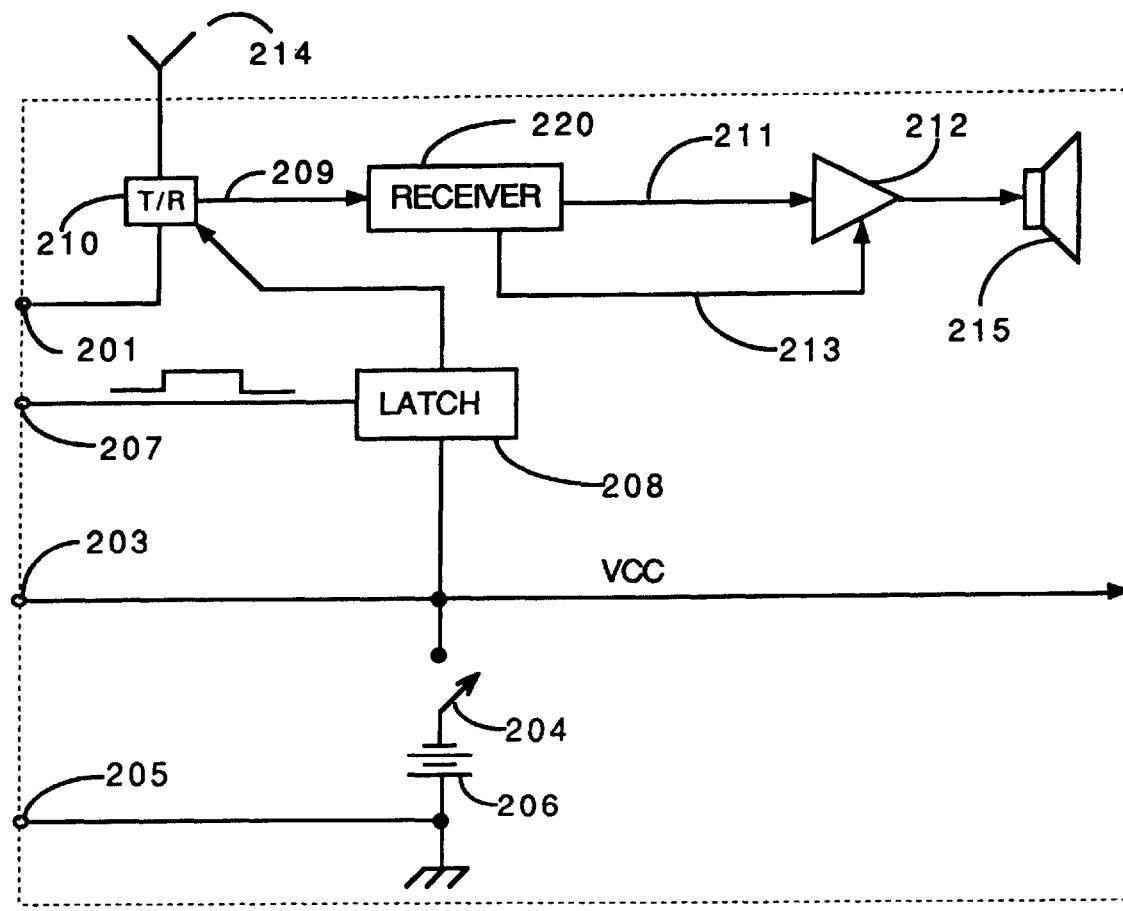
FIG. 5 is a functional block diagram of one of the earphones; the other is identical except that it receives the alternate stereo channel when applicable.

A block diagram of the earphone circuitry 200 is shown in FIG. 5. Said circuitry comprises a complete rf receiver system 220, that receives its signal to be selected and demodulated in the manner known to those familiar with the art, via line 209. In the programming mode, which is controlled by the scan controller 130 (FIG. 3) via contact 207, the transmit-receive switch 210 connects contact 201 to the said receiver via line 209. Said transmit-receive switch is placed in the aforementioned position by powering up said earphones by closing switch 204, which allows the internal battery 206 to be connected to the $V_{CC}$ line that powers all modules present in said earphones. Once the base unit 100 (FIG. 1) has selected an appropriate frequency for transmissions, input to latch 208 rises via contact 207 having received a voltage level from one-shot 194 (FIG. 3) in programmer 190 (FIG. 3) via line 129 (FIG. 3). The falling edge of said voltage level triggers latch 208 which commands switch 210 to disconnect line from contact 201 and connect antenna 214 to receiver 220 via line 209. At this point, the receiver is receiving and decoding the transmitted material encoded by the transmitter 160 (FIG. 3). The decoded audio signal is presented to audio amplifier 212 via line 211. Receiver 220 also produces an automatic gain control signal in a manner familiar to those skilled in the art, presenting said signal via line 213 to said audio amplifier for the purpose of controlling the gain of said amplifier should the signal at the antenna 214 weaken or strengthen due to the user moving too far from or too close to the base unit 100 (FIG. 1). Following amplification, the decoded audio signal is converted to sound-pressure waves by the electro-acoustic transducer 215, whereupon the user may listen to said audio signal while moving about the area.

In the preferred embodiment, receiver 220 is a simple phase-locked loop (PLL) well known to those skilled in the art. Said PLL is augmented in a manner likewise well known to provide a signal proportional to the strength of said carrier frequency for use as an automatic gain control in addition to the demodulated frequency- or phase-modulated carrier that is subsequently amplified and converted to the desired acoustic signal. The operation of said receiver as regards the particulars of the present invention is described in the paragraph above.

An alternate configuration that is more reliable in frequency locking and holding, but requires additional circuitry, is briefly described here. The alternate method relies on digital synthesis of frequency in the base unit 100 and communication of a digital code for said frequency to the earphones 200. This is accomplished by modifying the scan controller 130 as follows. Replace oneshot 144, integrator 146, and sample-and-hold 148 by an oscillator running at a rate of approximately 256 Hz and a monostable to produce a train of pulses that are presented to digital frequency synthesizer 170 via line 119. Upon receiving a pulse, said frequency synthesizer advances by approximately 50 KHz more or less, presenting said frequency to the channel detect 150, which functions as above. Upon selection of a suitable frequency band, channel detector 150 signals scan controller 130 as above via line 123. Said signal halts said oscillator, effectively maintaining the current digital count held by the digital frequency synthesizer 170. Said digital frequency synthesizer is then clocked by a signal from scan controller 130 via a line not shown to command said digital frequency synthesizer to present the coded word locked in its internal scalar/counter as a parallel 8-bit digital word to a parallel-to-serial converter in the scan controller 130. The serial code is subsequently sent to contact 101 during the logic level strobe from said scan controller via line 129. On the earphone side, via contact 201, the serial code is converted to a parallel digital 8-bit word by a serial-to-parallel converter (not shown) and read into the digital frequency synthesizer (not shown) contained as a part of receiver 220 of said earphones 200.

The Industrial Applicability

The present invention is aimed at the consumer entertainment area where individual users desire privacy or wish not to disturb near-by persons, desire freedom from constricting and unsightly wires, and desire to be unencumbered by a the source of sound entertainment or information attached to their person. The invention is useful to anyone already in possession of a primary sound source exemplified by but not restricted to a cassette tape player, a commercial-band fm or am radio, a compact-disk player, a television set, or any form of local sound monitor incorporating a microphone or other means of producing electro-acoustic information or entertainment As an add-on or auxiliary device to be used in conjunction with the aforementioned sound sources, possession of a device based on the present invention becomes a desirable goal. As a system incorporated into presently available primary sources of entertainment or information such as listed above by way of example, the present invention would materially extend the capability of such primary sources and hence increase the usefulness of said sources beyond that of said sources not incorporating the present invention.

Additionally, group activities such as museum tours wherein each group member's earphones are tuned to the same base unit would also be an appropriate and desirable application. There are specialized systems currently available that meet this requirement, but once manufacture as a consumer entertainment device, adaptation of the present invention to group usage would be much more cost effective than such presently available systems. This group-usage functionality is incorporated into the present invention by intention of design as described above.

By a simple modification, the receiver unit can be made to present its audio signal to a connector rather than to acoustic transducers. Such signal being available as a source of information for self-powered speakers containing appropriate audio amplifiers. This modification allows, for example, a remote, indoor sound source to service outdoor speakers, while maintaining the convenience of automatic channel selection.

What is claimed is:

1. A method, comprising:
    inserting an earphone into a base unit thereby electrically coupling the earphone to the base unit through a plurality of contacts;
    scanning a band for an open channel with the base unit;
    locking the earphone to the open channel;
    separating the earphone from the base unit;
    transmitting a signal from the base unit to the earphone on the open channel; and
    inserting another earphone into the base unit.

2. The method of claim 1, further comprising, after inserting, indicating a fault if the earphone is powered off.

3. The method of claim 1, wherein scanning includes advancing a shared frequency synthesizer until the open channel is located and then stopping the frequency synthesizer from advancing.

4. The method of claim 1, wherein locking includes conveying a frequency of the open channel to the earphone.

5. The method of claim 4, wherein conveying includes sending to the earphone a) a signal from a oneshot circuit located in the base unit and b) a sample of an output from a shared frequency synthesizer located in the base unit.

6. The method of claim 4, wherein conveying Includes sending to the earphone data representing the frequency of the open channel for use in controlling a digital frequency synthesizer located in the earphone.

7. The method of claim 1, further comprising powering up the earphone and the base unit before scanning.

8. The method of claim 1, wherein transmitting includes transmitting an alternative stereo channel from the base unit to the another earphone.

9. The method of claim 1, further comprising locking an additional earphone to a preselected channel.

10. The method of claim 1, wherein transmitting includes a modulation technique selected from the group consisting of frequency-modulation, phase-modulation and pulse-modulation.

11. The method of claim 1, wherein transmitting includes spread-spectrum modulation.

12. The method of claim 1, wherein transmitting includes a multiplexing technique selected from the group consisting of time-division multiple access, code division multiple access and frequency-division multiple access.

13. The method of claim 1, further comprising coupling a source device to an audio-in signal connector of the base unit.

14. The method of claim 1, further comprising charging the earphone power supply with the base unit power supply.

15. An electromagnetic waveform produced by the method of claim 1.

16. An apparatus, comprising:
a base unit including
a power supply,
a battery charger coupled to the power supply,
a receptacle coupled to the battery charger, the receptacle having contacts,
a shared frequency synthesizer,
a transmit-receive switch coupled to the shared frequency synthesizer,
a scanner having a scan controller coupled to the transmit-receive switch and a channel detector coupled to the scan controller,
a programmer coupled to the scanner,
a transmitter having a modulator coupled to the transmit-receive switch and an amplifier coupled to the modulator,
an audio-in signal connector coupled to the modulator, and
an antenna coupled to the amplifier and the channel detector; and
an earphone including a latch, a transmit-receive switch coupled to the latch, a receiver coupled to the transmit-receive switch, and an amplifier coupled to the receiver, the earphone adapted to a) be inserted into the receptacle of the base unit and b) make electrical contact with the contacts of the receptacle,
wherein the base unit includes another receptacle and, further comprising, another earphone.

17. The apparatus of claim 16, wherein the another earphone is adapted to provide an alternative stereo channel.

18. An apparatus, comprising:
a base unit including
a power supply,
a battery charger coupled to the power supply,
a receptacle coupled to the battery charger, the receptacle having contacts,
a shared frequency synthesizer,
a transmit-receive switch coupled to the shared frequency synthesizer,
a scanner having a scan controller coupled to the transmit-receive switch and a channel detector coupled to the scan controller,
a programmer coupled to the scanner,
a transmitter having a modulator coupled to the transmit-receive switch and an amplifier coupled to the modulator,
an audio-in signal connector coupled to the modulator, and
an antenna coupled to the amplifier and the channel detector; and
an earphone including a latch, a transmit-receive switch coupled to the latch, a receiver coupled to the transmit-receive switch, and an amplifier coupled to the receiver, the earphone adapted to a) be inserted into the receptacle of the base unit and b) make electrical contact with the contacts of the receptacle,
wherein the base unit includes a secondary program control circuit that locks an additional earphone to a preselected channel.

19. The apparatus of claim 18, further comprising a plurality of additional earphones that can be preprogrammed to a single group channel.

20. The apparatus of claim 16, wherein the scan controller includes a circuit for indicating a fault if the earphone is located in the receptacle and powered off.

21. The apparatus of claim 16 wherein the programmer includes a oneshot circuit an integrator coupled to the oneshot circuit and a sample and follow circuit coupled to both the integrator and the scanner.

22. The apparatus of claim 16, wherein the channel detector includes a band-pass filter, an RF amplifier coupled to the band-pass filer a mixer coupled to both the RF amplifier and the shared frequency synthesizer, a low-pass filter coupled to the mixer, an integrator coupled to the low-pass filter and a comparator coupled to the integrator.

23. The apparatus of claim 16, wherein the shared frequency synthesizer includes a voltage controlled oscillator and a band-pass filter coupled to the voltage controlled oscillator.

24. The apparatus of claim 16, wherein the shared frequency synthesizer includes a digital frequency synthesizer, the programmer includes an oscillator controlling the digital frequency synthesizer, the scan controller includes a parallel to serial converter coupled to the digital frequency synthesizer, and the earphone includes another digital frequency synthesizer.

25. The apparatus of claim 16, wherein the transmitter performs a modulation technique selected from the group consisting of frequency-modulation, phase-modulation and pulse modulation.

26. The apparatus of claim 16, wherein the transmitter includes a spread-spectrum transmitter.

27. The apparatus of claim 16, wherein the transmitter performs a multiplexing technique selected from the group consisting of time-division multiple access, code-division multiple access and frequency-division multiple access.

28. The apparatus of claim 16, wherein the earphone includes monolithic integrated, discrete-component circuits.

29. The apparatus of claim 16, wherein the earphone includes an electro-acoustic transducer coupled to the amplifier.

30. The apparatus of claim 16, wherein the earphone includes a connector coupled to the amplifier.

31. The apparatus of claim 16, further comprising a source device coupled to the audio-in signal connector of the base unit.

32. The apparatus of claim 31, wherein the source device includes a microphone.

33. The apparatus of claim 31, wherein the source device includes an impedance-matching amplifier and a gain control.

34. The apparatus of claim 16, wherein the source device includes a receiver.

35. The apparatus of claim 31, wherein the source device includes a tape player.

36. The apparatus of claim 16, wherein the source device includes a compact-disk player.

37. A broadcast network, comprising the apparatus of claim 16.

* * * * *